US006432194B2

(12) United States Patent
Johnson et al.

(10) Patent No.: US 6,432,194 B2
(45) Date of Patent: Aug. 13, 2002

(54) METHOD OF ATTACHING A GROUP TO A PIGMENT

(75) Inventors: Joseph E. Johnson; Nanying Bian; Collin P. Galloway, all of Nashua, NH (US)

(73) Assignee: Cabot Corporation, Boston, MA (US)

(*) Notice: Subject to any disclaimer, the term of this patent is extended or adjusted under 35 U.S.C. 154(b) by 0 days.

(21) Appl. No.: 09/752,230

(22) Filed: Dec. 29, 2000

Related U.S. Application Data

(62) Division of application No. 09/285,253, filed on Apr. 2, 1999, now Pat. No. 6,336,965.
(60) Provisional application No. 60/080,598, filed on Apr. 3, 1998.

(51) Int. Cl.$^7$ .......................... C09B 67/22; C09B 69/00
(52) U.S. Cl. ...................... 106/499; 106/412; 106/493; 106/496; 106/497; 106/498; 106/476
(58) Field of Search ................................ 106/499, 410, 106/412, 493, 496, 497, 498, 476

(56) References Cited

U.S. PATENT DOCUMENTS

| | | | |
|---|---|---|---|
| 2,439,442 A | | 4/1948 | Amon et al. ................ 23/209.1 |
| 2,502,254 A | | 3/1950 | Glassman .................... 106/289 |
| 2,514,236 A | | 7/1950 | Glassman .................... 106/289 |
| 2,867,540 A | | 1/1959 | Harris ......................... 106/307 |
| 3,025,259 A | | 3/1962 | Watson et al. .............. 260/41.5 |
| 3,043,708 A | | 7/1962 | Watson et al. .............. 106/307 |
| 3,335,020 A | | 8/1967 | Aboytes et al. ............. 106/307 |
| 3,479,300 A | | 11/1969 | Rivin et al. .................. 252/430 |
| 4,014,844 A | | 3/1977 | Vidal et al. ................. 260/31.2 |
| 4,871,371 A | | 10/1989 | Harris ............................. 8/403 |
| 4,909,852 A | | 3/1990 | Atkinson ..................... 106/448 |
| 4,946,509 A | | 8/1990 | Schwartz et al. ........... 106/496 |
| 5,281,261 A | | 1/1994 | Lin et al. ................... 106/20 R |
| 5,418,277 A | | 5/1995 | Ma et al. ..................... 524/520 |
| 5,545,504 A | | 8/1996 | Keoshkerian et al. ....... 430/137 |
| 5,554,739 A | * | 9/1996 | Belmont ...................... 534/739 |
| 5,571,311 A | | 11/1996 | Belmont et al. ............... 106/20 |
| 5,630,868 A | * | 5/1997 | Belmont et al. ......... 106/31.75 |
| 5,672,198 A | * | 9/1997 | Belmont ................... 106/31.75 |
| 5,698,016 A | * | 12/1997 | Adams et al. ............. 106/31.6 |
| 5,707,432 A | * | 1/1998 | Adams et al. ............. 106/31.6 |
| 5,713,988 A | | 2/1998 | Belmont et al. ........... 106/31.6 |
| 5,714,993 A | | 2/1998 | Keoshkerian et al. ......... 347/95 |
| 5,747,559 A | | 5/1998 | Whitehouse et al. ....... 523/205 |
| 5,747,562 A | * | 5/1998 | Mahmud et al. ............ 523/215 |
| 5,749,950 A | * | 5/1998 | Mahmud et al. .......... 106/31.6 |
| 5,803,959 A | * | 9/1998 | Johnson et al. ......... 106/31.75 |
| 5,837,045 A | * | 11/1998 | Johnson et al. .......... 106/31.85 |
| 5,851,280 A | * | 12/1998 | Belmont et al. ............. 106/472 |
| 5,871,706 A | | 2/1999 | Whitehouse et al. ..... 423/449.2 |
| 5,872,177 A | | 2/1999 | Whitehouse ................. 524/495 |
| 5,885,335 A | * | 3/1999 | Adams et al. ............. 106/31.6 |
| 5,895,522 A | * | 4/1999 | Belmont et al. ........... 106/31.6 |
| 5,900,029 A | * | 5/1999 | Belmont et al. ............... 8/550 |
| 5,914,806 A | | 6/1999 | Gordon, II et al. ......... 359/296 |
| 5,922,118 A | * | 7/1999 | Johnson et al. ............ 106/31.6 |
| 5,955,232 A | * | 9/1999 | Little et al. ................. 430/106 |
| 5,964,935 A | | 10/1999 | Chen et al. .................. 106/401 |
| 5,968,243 A | * | 10/1999 | Belmont et al. ......... 106/31.65 |
| 5,976,233 A | | 11/1999 | Osumi et al. ............. 106/31.75 |
| 6,042,643 A | * | 3/2000 | Belmont et al. ............. 106/472 |
| 6,054,238 A | * | 4/2000 | Little et al. ................. 430/106 |
| 6,068,688 A | | 5/2000 | Whitehouse et al. .... 106/31.65 |
| 6,110,994 A | * | 8/2000 | Cooke et al. ................ 523/215 |
| 6,169,129 B1 | * | 1/2001 | Mahmud et al. ............ 523/215 |
| 6,197,274 B1 | * | 3/2001 | Mahmud et al. ......... 423/449.2 |

FOREIGN PATENT DOCUMENTS

EP        0 054 904        6/1982        ........... C09B/29/15

(List continued on next page.)

OTHER PUBLICATIONS

International Search Report for PCT/US99/07461, mailed Jul. 28, 1999.

Derwent Abstract No. 82–28019E (Oct. 17, 1979), "Penetrate Flexographic Print Ink Based Polyacrylic Resin Modified Maleinised Rosin Modified Carbon Black".

JP90–0134478 to Mitsubishi Kasei Corp, Publication Date Jan. 31, 1992 Abstract Only (from Derwent).

JP96–0105108 to Mitsubishi Chem Corp, Publication Date Nov. 11, 1997 Abstract Only (from Derwent).

JP11080636 A to Canon Inc., Publication Date Mar. 26, 1999 Abstract Only (from Patent Abstracts of Japan).

Primary Examiner—Anthony J. Green

(57) ABSTRACT

Various modified pigment products are described which are preferably capable of being dispersed in a variety of materials such as coatings, inks, toners, films, plastics, polymers, elastomers, and the like. The modified pigments are pigments having attached groups, such as polymeric groups, onto the pigment by means other than adsorption. A modified pigment product is described comprising a pigment having attached at least one group comprising the formula:

$$—X—[NIon]_p R$$

wherein X comprises an aromatic group or an alkyl group, NIon comprises at least one type of non-ionic group, R represents hydrogen or comprises an aromatic group or an alkyl group, and p represents an integer from 1 to 500. Modified pigment products are also described comprising a pigment having attached at least one alkylene oxide group or at least one polymeric group. In addition, other types of modified pigment products are described as well as their incorporation into inks, coatings, toners, films, plastics, polymers, elastomers, and the like. Methods of making the modified pigment products are also described.

8 Claims, No Drawings

FOREIGN PATENT DOCUMENTS

| | | | |
|---|---|---|---|
| EP | 0 247 782 | 12/1987 | ............. D06P/3/52 |
| EP | 0 437 105 | 7/1991 | ............ C09B/69/10 |
| EP | 0 529 162 | 3/1993 | ............ C09B/69/10 |
| EP | 0 677 556 A2 | 10/1995 | ............ C09B/67/08 |
| FR | 2 393 036 | 6/1978 | ............ C09B/67/00 |
| FR | 2 442 258 | 6/1980 | ............ C09B/69/00 |
| GB | 2 036 779 | 7/1980 | ............ C09B/31/02 |
| JP | 6-128517 | 5/1994 | ............ C09D/11/02 |
| WO | WO 96/18688 | 6/1996 | ............. C09C/1/56 |
| WO | WO 96/18695 | 6/1996 | ........... C09D/11/00 |
| WO | WO 97/47697 | 12/1997 | ........... C09D/11/00 |
| WO | WO 97/48769 | 12/1997 | ........... C09B/67/22 |
| WO | WO 99/23174 | 5/1999 | ............. C09C/1/56 |
| WO | WO 99/31175 | 6/1999 | ............. C08K/9/04 |
| WO | WO 99/51690 | 10/1999 | ........... C09B/69/00 |
| WO | WO 99/63007 | 12/1999 | ............. C09C/1/56 |

* cited by examiner

METHOD OF ATTACHING A GROUP TO A PIGMENT

This application is a divisional of non-provisional application Ser. No. 09/285,253, filed Apr. 2, 1999 U.S. Pat. No. 6,336,965, which claims priority to provisional application Ser. No. 60/080,598, filed Apr. 3, 1988, the specification of which is incorporated in its entirety.

BACKGROUND OF THE INVENTION

The present invention relates to pigments which can be used in a variety of applications, and more particularly relates to the modification of pigments to improve various properties.

Pigments have been used in a variety of applications, such as in inks, coatings, toners, plastics, rubber, films, and the like. Common goals in each of these applications are to provide a pigment which is capable of being substantially and uniformly dispersed, and capable of remaining dispersed in the composition so that color and other properties exhibited by the pigment are uniform throughout the composition or material which incorporates the pigment. The improvement in the dispersibility and dispersion stability of pigments has been attempted previously and has included coating or adsorbing various surfactants onto the pigment. However, merely adsorbing or coating pigments had potentially several disadvantages. First, adsorbed surfactants are dependent on the physical properties of the surrounding materials, such as the solvent with the ink. In such a situation, an equilibrium may exist between the surface of the pigment and the solvent for surfactant affinity. Solubility issues involving the surfactant and the solvent may also come into effect. Other considerations which can effect adsorbed surfactants are the concentration of the pigment, the type of surfactants used, and the temperature and pH of the composition or material containing the pigment. Any one or more of these physical properties can cause the removal of the surfactant from the surface of the pigment and create additional surfactant in the bulk liquid or medium which may negatively effect the dispersion stability and other properties of the bulk liquid such as foaming, surface tension, viscosity, film strength, film elasticity, and the like. In addition, the excess surfactant which may be found in conventional pigments may also be determined to plastic or film-forming properties, such as color, strength, elongation, elasticity, and the like. Accordingly, there is a desire in the art to improve the dispersibility and dispersion stability of pigments with respect to overcoming one or more of the above-described disadvantages.

SUMMARY OF THE INVENTION

A feature of the present invention is to provide modified pigment products which are capable of improving the dispersibility and dispersion stability of the pigment in compositions and formulations.

Another feature of the present invention is to provide ink, coating, toner, polymer, paper, film, and rubber formulations which incorporate the modified pigment products of the present invention.

An additional feature of the present invention is to provide a method to improve the dispersibility and dispersion stability of pigments in various compositions and formulations.

Additional features and advantages of the present invention will be set forth in part in the description which follows, and in part will be apparent from the description, or may be learned by practice of the present invention. The objectives and other advantages of the present invention will be realized and obtained by means of the elements and combinations particularly pointed out in the written description and appended claims.

To achieve these and other advantages and in accordance with the purpose of the present invention, as embodied and broadly described herein, the present invention relates to a modified pigment product containing a pigment having attached at least one group comprising the formula:

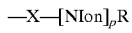

wherein X represents an aromatic group or an alkyl group, NIon represents at least one type of non-ionic group, R represents hydrogen, a substituted or unsubstituted aromatic group, or a substituted or unsubstituted alkyl group, and p represents an integer of from 1 to 500.

The present invention further relates to a modified pigment product containing a pigment having attached at least one group comprising the formula:

wherein X represents an aromatic group or an alkyl group; A represents an alkylene oxide group of from about 1 to about 12 carbons; p represents an integer of from 1 to 500, and R represents hydrogen, a substituted or unsubstituted alkyl group, or a substituted or unsubstituted aromatic group. A can be the same or different when p is greater than 1. X can be substituted or unsubstituted and can include substituted groups such as an ester group, an amide group, an ether group, a carbonyl group, an aryl group, an alkyl group, and the like. The substituted groups can be attached or linked to A.

The present invention in addition, relates to a modified pigment product containing a pigment having attached at least one group comprising the formula:

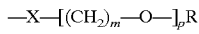

wherein X represents an aromatic group or an alkyl group, m represents an integer of from 1 to 12, preferably 2 or 3, p represents an integer of from 1 to 500, and R represents hydrogen, a substituted or unsubstituted alkyl group, or a substituted or unsubstituted aromatic group.

Further, the present invention relates to a modified pigment product comprising a pigment having attached at least one polymeric group, wherein the polymeric group comprises the formula:

wherein X represents at least an aromatic group or an alkyl group, "polymer" represents repeating monomer or multiple monomer groups or both, optionally having at least one X' group. The total monomer repeating units is from about 1 to about 500. R represents hydrogen, a bond, a substituted or unsubstituted alkyl group, or a substituted or unsubstituted aromatic group. When X represents an alkyl group, the "polymer" preferably has no ionic or ionizable group. X' represents an aromatic group or alkyl group and each X' and X can be the same or different. X and/or X' can be substituted or unsubstituted and can include substituted groups such as an ester group, an amide group, an ether group, and the like. The substituted groups can be linked to "polymer". Also, when R represents a bond, the available bond can be attached to the pigment.

The present invention also relates to ink compositions containing at least one modified pigment product of the present invention and at least one ink vehicle.

The present invention also relates to coating compositions comprising at least one modified pigment product of the present invention and at least one coating vehicle.

The present invention also relates to toner compositions containing at least one modified pigment product of the present invention and resin particles.

Also, the present invention relates to a rubber products, polymer (e.g., plastics) products, and films containing conventional ingredients in combination with at least one modified pigment product of the present invention.

It is to be understood that both the foregoing general description and the following detailed description are exemplary and explanatory only and are intended to provide further explanation of the present invention, as claimed.

DETAILED DESCRIPTION OF THE PRESENT INVENTION

The present invention in general relates to various types of modified pigment products which are preferably capable of dispersing in a variety of materials including, but not limited to, liquids (aqueous and non-aqueous), polymers (e.g., thermoplastics and thermosets), elastomers (e.g., synthetic and/or natural rubbers), coatings (e.g., paints), inks (e.g., printing inks and inkjet inks), liquid and solid toners, films and the like. The pigments are modified such that chemical groups (e.g., polymeric and organic) are attached onto the pigment which provides a more stable attachment of the groups onto the pigment compared to adsorbed groups, e.g., polymers, surfactants and the like.

In each of the following formulas, —X is attached directly to the pigment and —X' can be directly attached to the pigment.

One preferred modified pigment product is a pigment having attached at least one group comprising the formula:

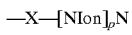

wherein X represents an aromatic group or an alkyl group, NIon represents at least one non-ionic group, R represents hydrogen, an aromatic group, or an alkyl group, and p is an integer of from 1 to 500.

The aromatic group with respect to the X substituent and/or the R substituent can be substituted or unsubstituted and can be, for instance, an aryl or heteroaryl group. The aromatic group can be substituted with any group, such as one or more alkyl groups or aryl groups. Preferably, the aromatic group is a phenyl, naphthyl, anthracenyl, phenanthrenyl, biphenyl, pyridinyl, benzothiadiazolyl, or benzothiazolyl. Examples of the alkyl group with respect to the X substituent and/or the R substituent include, but are not limited to, substituted or unsubstituted alkyl groups which may be branched or unbranched. The alkyl group can be substituted with one or more groups, such as aromatic groups. Preferred examples of the alkyl group for purposes of the X substituent include, but are not limited to, $C_1$–$C_{12}$, like methyl, ethyl, propyl, butyl, pentyl, or hexyl groups. In other words, X and/or R can represent a branched or unbranched, substituted or unsubstituted, saturated or unsaturated hydrocarbon. Examples of substituted groups include, but are not limited to, an ester group, an amide group, an ether group, a carboxyl group, an aryl group, an alkyl group, and the like.

Examples of the non-ionic group include, but are not limited to, groups having no apparent ionic charge, such as polymers of ethylene oxide, propylene oxide, other alkylene oxides, carboxylic acid esters, glycols, alcohols, esters, alkanolamine-fatty acid condensates, silicones, isocyanates, alkylpyrrolidenes, and alkylpolyglycosides. In ion-aqueous media, the non-ionic group, in addition, to the aforementioned groups, may have carboxylates, sulfonates, phosphates, amines, and other groups that typically demonstrate an ionic nature in water. The non-ionic group is preferably a $C_1$–$C_{12}$ alkyl group, or a $C_1$–$C_{12}$ alkylene oxide group. p can be 1–25, 26–50, 51–75, 75–100, and/or 101–500, and p preferably is 5 to 50.

The X substituent and/or non-ionic group may be substituted with one or more functional groups. The functional group preferably contains a lyophilic group. Examples of functional groups include, but are not limited to, R', OR', COR', COOR', OCOR', carboxylates, halogens, CN, NR'$_2$, SO$_3$H sulfonates, —OSO$_3$, NR'(COR'), CONR'$_2$, NO$_2$, PO$_3$H$_2$, phosphonates, phosphates, N=NR', SOR', NSO$_2$R', wherein R' which can be the same or different, is independently hydrogen, branched or unbranched $C_1$–$C_{20}$ substituted or unsubstituted, saturated or unsaturated hydrocarbons, e.g., alkyl, alkenyl, alkynyl, substituted or unsubstituted aryl, substituted or unsubstituted heteroaryl, substituted or unsubstituted alkyoaryl, or substituted or unsubstituted arylalkyl.

Amines also represent examples of functional groups as well as quaternary ammonium groups (—NR$_3^+$) and quaternary phosphonium groups (—PR$_3^+$), as well as quaternary sulfonium groups (—SR$_2^+$).

In an additional embodiment of the present invention, the modified pigment product can be a pigment having attached at least group comprising the formula:

wherein X represents an aromatic group or an alkyl group; A represents an alkylene oxide group of from about 1 to about 12 carbons; p represents an integer from 1 to 500, and R represents hydrogen, a substituted or unsubstituted alkyl group, or a substituted or unsubstituted aromatic group. A can be the same or different when p is greater than 1. X can be substituted or unsubstituted and can include substituted groups such as an ester group, an amide group, an ether group, a carbonyl group, an aryl group, an alkyl group and the like. The substituted groups can be attached or linked to A.

Examples of preferred alkylene groups include, but are not limited to, —CH$_2$—CH$_2$—O—; —CH(CH$_3$)—CH$_2$—O—; —CH$_2$CH$_2$CH$_2$—O—; or combinations thereof.

In another embodiment of the present invention, the modified pigment product can be a pigment having attached at least one group comprising the formula:

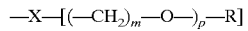

wherein X is described above, and for instance can represent an aromatic group or an alkyl group as described earlier, m is an integer of from 1 to 12, preferably 2 or 3, p is an integer of from 1 to 500, and R is described above, and for instance can be hydrogen, a substituted or unsubstituted alkyl group, or a substituted or unsubstituted aromatic group. Examples of R substituents include, but are not limited to, hydrogen, methyl, ethyl, butyl, or propyl groups. p can be 1–25, 26–50, 51–75, 76–100, and 101–500, and is preferably 5 to 50. Particularly preferred groups of this formula are where X is a benzene group, m is 1 to 5, and more preferably 2 or 3, p is 5 to 50, more preferably 44–45, and R is hydrogen or a methyl group. Another preferred group is where m is 2, p is 7, R is a methyl group, and X is a benzene group.

In yet another embodiment of the present invention, the modified pigment product can be a pigment having attached at least one polymeric group, wherein the polymeric group comprises the formula:

—X—[polymer]R wherein X is described above, and for instance can represent at least an aromatic group or at least an alkyl group as described earlier, "polymer" comprises repeating monomer groups or multiple monomer groups or both, optionally having at least one —X' group. The 'polymer' can be substituted or unsubstituted with additional groups, and R is described above, and for instance can represent hydrogen, a bond, a substituted or unsubstituted alkyl group, or a substituted or unsubstituted aromatic group. When X represents an alkyl group, the "polymer" preferably has no ionic or ionizable group. X' represents an aromatic group or alkyl group, and each X' and X can be the same or different. The total monomer repeating units that comprise the "polymer" is not greater than about 500 monomer repeating units. X and/or X' can be substituted or unsubstituted and can include substituted groups such as an ester group, an amide group, an ether group, and the like. The substituted groups can be linked to the "polymer". Also, when R represents a bond, the available bond can be attached to the pigment. When X represents an alkyl group in this formula, the polymeric group preferably has no ionic or ionizable group. The polymeric group can be any polymeric group capable of being attached to a pigment.

For purposes of the present invention and this formula immediately above, one or more polymeric groups that comprise the "polymer" can be present. The polymeric group can be a thermoplastic polymeric group or a thermosetting polymeric group. Further, the polymeric group can be a homopolymer, copolymer, terpolymer, and/or a polymer containing any number of different repeating units. Further, the polymeric group present in the present invention can be any type of polymeric group, such as a random polymer, alternating polymer, graft polymer, block polymer, star-like polymer, and/or comb-like polymer. The polymeric group used in the present invention can also be one or more polyblends. The polymeric group can be an interpenetrating polymer network (IPN); simultaneous interpenetrating polymer network (SIN); or interpenetrating elastomeric network (IEN).

Specific examples of polymeric groups include, but are not limited to, linear-high polymers such as polyethylene, poly(vinylchloride), polyisobutylene, polystyrene, polycaprolactam (nylon), polyisoprene, and the like. Other general classes of polymeric groups of the present invention are polyamides, polycarbonates, polyelectrolytes, polyesters, polyethers (polyhydroxy)benzenes, polyimides, polymers containing sulfur (such as polysulfides, (polyphenylene) sulfide, and polysulfones), polyolefins, polymethylbenzenes, polystyrene and styrene copolymers (ABS included), acetal polymers, acrylic polymers, acrylonitrile polymers and copolymers, polyolefins containing halogen (such a polyvinyl chloride and polyvinylidene chloride), fluoropolymers, ionomeric polymers, polymers containing ketone group(s), liquid crystal polymers, polyamide-imides, polymers containing olefinic double bond(s) (such as polybutadiene, polydicyclopentadiene), polyolefin copolymers, polyphenylene oxides, poly(vinyl alcohols), polyurethanes, thermoplastic elastomers, and the like.

Generally, the polymeric groups described in Volume 18 of the Encyclopedia of Chemical Technology, KIRK-OTHMER, (1982), page 328 to 887, and Modern Plastics Encyclopedia '98, pages B-3 to B-210, and "Polymers: Structure and Properties," by C. A. Daniels, Technomic Publishing Co., Lancaster, Pa. (1989), all incorporated in their entirety herein by reference, can be used as the polymeric groups of the present invention.

The polymeric groups of the present invention can be prepared in a number of ways and such ways are known to those skilled in the art. The above referenced KIRK-OTHMER section, Modern Plastics Encyclopedia, and C. A. Daniel's reference provide methods in which these polymeric groups can be prepared.

The polymeric group is preferably a polyolefin group, a polyurethane group, a polystyrenic group, a polyacrylate group, a polyamide group, a polyester group, or mixtures thereof. Examples of R groups can be the same as previously described above. p can be 1–25, 26–50, 51 . 75, 76–100, 101–500, and is preferably 1 to 100, and more preferably 5 to 50.

The pigment to be modified can be, but is not limited to, pigments traditionally used in ink compositions (including inkjet ink compositions), coating compositions (including paint formulations), liquid and solid toners, films, plastics, rubbers, and the like.

Examples include, but are not limited to, black pigments (e.g., carbon products like carbon black) and other colored pigments (e.g., polymeric and organic pigments).

The desired colored pigment may be chosen from a wide range of conventional colored pigments. The colored pigments can be blue, black, white, brown, cyan, green, violet, magenta, red, yellow, as well as mixtures thereof. Suitable classes of colored pigments include, for example, anthraquinones, phthalocyanine blues, phthalocyanine greens, diazos, monoazos, pyranthrones, perylenes, heterocyclic yellows, quinacridones, and (thio)indigoids. Representative examples of phthalocyanine blues include copper phthaocyanine blue and derivatives thereof (Pigment Blue 15). Representative examples of quinacridones include Pigment Orange 48, Pigment Orange 49, Pigment Red 122, Pigment Red 192, Pigment Red 202, Pigment Red 206, Pigment Red 207, Pigment Red 209, Pigment Violet 19 and Pigment Violet 42. Representative examples of anthraquinones include Pigment Red 43, Pigment Red 194 (Perinone Red), Pigment Red 216 (Brominated Pyanthrone Red) and Pigment Red 226 (Pyranthrone Red). Representative examples of perylenes include Pigment Red 123 (Vermillion), Pigment Red 149 (Scarlet), Pigment Red 179 (Maroon), Pigment Red 190 (Red), Pigment Violet, Pigment Red 189 (Yellow Shade Red) and Pigment Red 224. Representative examples of thioindigoids include Pigment Red 86, Pigment Red 87, Pigment Red 88, Pigment Red 181, Pigment Red 198, Pigment Violet 36, and Pigment Violet 38. Representative examples of heterocyclic yellows include Pigment Yellow 1, Pigment Yellow 3, Pigment Yellow 12, Pigment Yellow 13, Pigment Yellow 14, Pigment Yellow 17, Pigment Yellow 65, Pigment Yellow 73, Pigment Yellow 74, Pigment Yellow, Pigment Yellow 117, Pigment Yellow 128 and Pigment Yellow 138. Such pigments are commercially available in either powder or press cake form from a number of sources including, BASF Corporation, Engelhard Corporation and Sun Chemical Corporation. Examples of other suitable colored pigments are described in the Color Index, 3rd edition (The Society of Dyers and Colourists, 1982). Representative examples of black pigments include various carbon blacks (Pigment Black 7) such as channel blacks, furnace blacks and lamp blacks, and include, for example, carbon blacks sold under the Regal®, Black Pearls®, Elftex®, Monarch®, Mogul®, and Vulcan® trademarks available from Cabot Corporation (such as Black Pearls®

2000, Black Pearls® 1400, Black Pearls® 1300, Black Pearls® 1100, Black Pearls® 1000, Black Pearls ®900, Black Pearls® 880, Black Pearls® 800, Black Pearls® 700, Black Pearls® L, Elftex® 8, Monarch® 1400, Monarch® 1300, Monarch® 1100, Monarch® 1000, Monarch® 900, Monarch®880, Monarch® 800, Monarch® 700, Mogul® L, Regal® 330, Regal® 400, Vulcan® P). Other suitable carbon blacks include, but are not limited to, Printex 40, Printex 8, Printex 300, Printex L, Printex U, Printex V, Special Black 4, Special Black 5, FW200, (the foregoing available from Degussa Corporation), Raven 780, Raven 890, Raven 1020, Raven 1040, Raven 1255, Raven 1500, Raven 5000, Raven 5250 (the foregoing available from Columbian Chemical Corporation) and MA100 and MA440 available from Mitsubishi Chemical Corporation. The colored pigment will typically have a wide range of BET surface areas, as measured by nitrogen adsorption. Preferably, the colored pigment has a surface area equal to greater than 85 $m^2/g$, and more preferably equal or greater than and 100 $m^2/g$, thereby corresponding to a smaller primary/aggregate particle size. Such surface areas have been found to provide for a more uniform distribution and efficient level of treating agent on the surface of the pigment and a higher percent yield of the surface-modified colored pigment after post processing techniques. If the preferred higher surface area of the colored pigment (thereby corresponding to a smaller particle size) is not readily available, it is well recognized by those skilled in the art that the colored pigment may be subject to conventional size comminution or reduction techniques, such as ball or jet milling, to reduce the pigment to the desired particle size.

Carbon product as used herein, is preferably capable of reacting with a diazonium salt to form the above-mentioned modified carbon product. The carbon may be of the crystalline or amorphous type. Examples include, but are not limited to, graphite, carbon black, vitreous carbon, carbon fibers, activated charcoal, and activated carbon. Finely divided forms of the above are preferred; also, it is possible to utilize mixtures of different carbons.

Also, any conventional amounts of the pigment used in the desired application can be present in compositions of the present invention. Preferably, with respect to an ink composition, for instance, the pigment can be present in an amount of from 1 wt % to about 25 wt % or higher, and more preferably from about 3 wt % to about 10 wt %, based on the weight of the ink composition.

For purposes of the present invention, one or more types of chemical groups can be attached to the same and/or different pigments.

The modified pigment products may be prepared by reacting the pigment as defined above with a diazonium salt in a liquid reaction medium to attach at least one group to the surface of the pigment. Preferred reaction media include water, any medium containing water, and any medium containing alcohol. Water is the most preferred medium.

To prepare the above modified pigment products, the diazonium salt need only be sufficiently stable to allow reaction with the pigment. Thus, that reaction can be carried out with some diazonium slats otherwise considered to be unstable and subject to decomposition. Some decomposition processes may compete with the reaction between the pigment and the diazonium salt and may reduce the total number of groups attached to the pigment. Further, the reaction may be carried out at elevated temperatures where many diazonium salts may be susceptible to decomposition. Elevated temperatures may also advantageously increase the solubility of the diazonium salt in the reaction medium and improve its handling during the process. The pigment can be reacted with a diazonium salt when present as a dilute, easily stirred, aqueous slurry, or as a more concentrated highly mixed slurry in water.

A preferred method of preparing the modified pigment products involves reducing the pigments to be modified to a size desirable for the particular end use application. If, of course, the pigment is already of an appropriate size, then no reduction in size is necessary. Generally, the size of the pigment can be the same size as the pigment sizes used conventionally for the particular end use applications. For instance, the average particle size of the pigment can be about 10 microns or less, and preferably about 5 microns or less. Preferably, for instance, in inkjet ink applications, the average pigment particle size is preferably less than about 1 micron and more preferably less than about 0.5 micron (e.g., a preferred range is about 0.01 micron to less than about 1 micron), and is preferably less than about 10 microns for coatings, toner, polymer, and rubber applications. If size reduction of the pigment to be modified is preferred, any method of reducing size can be used such as those described in T. C. Patton, "Paint Flow and Pigment Dispersion," 2nd ed., Wiley, N.Y. (1979), incorporated herein by reference.

To attach a group having one or more of the formulas described above, a surfactant or polymer may be introduced to or contacted with the pigments. The surfactant or polymer comprises an organic group or polymeric group having at least one primary amine. A sufficient amount of time is provided to preferably adsorb the surfactant or polymer onto the pigment. Preferably, after adsorption occurs, a diazonium reaction can be conducted as described in U.S. Pat. Nos. 5,571,311 and 5,630,868, as well as 5,554,739 and PCT Publication WO-96/18688, all incorporated herein in their entirety by reference. In more detail, the preferred means of attaching the surfactant or polymer onto the pigments is by grinding, or reducing in size by other suitable mechanical or chemical means, the pigment in the presence of a solvent (e.g., aqueous or non-aqueous), preferably water. The surfactant or polymer can also be present during this size reduction step. Alternatively, the surfactant or polymer may be added after the size reduction step. An aqueous solution of a nitrite and an acid are then added separately or together to generate the diazonium reaction and form the diazonium salt which reacts with the pigment. This generation of the diazonium salt is preferably accomplished in situ with the pigment.

The surfactant or polymer is preferably any group capable of attaching onto a pigment through a diazonium reaction. In more detail, the surfactant or polymer will typically have a primary amine group attached to polymeric groups or organic groups, like aromatic or alkyl groups (e.g., the X substituent) set forth in the formulas above. In the diazonium reaction, the primary amine group will react to form nitrogen gas or other by-products which will then permit the group, for instance the aromatic group or alkyl group, to attach onto the pigment.

Typically known surfactants or polymers may be modified to comprise a primary amine using known techniques to those skilled in heart, such as esterification involving an aromatic or alkyl group and the surfactant or polymer and reduction of nitro groups on the aromatic or alkyl group to the corresponding primary amine groups. Nitration of the surfactant or polymer followed by reduction, or amination of the surfactant or polymer are some other techniques that may be used. Surfactants are commercially available under various well-known trademarks, such as the PLURONIC® series (BASF Corporation, Parsippany, N.J.), the TETRONIC® series (BASF Corporation, Parsippany, N.J.), the ARQUAD® series (Akzo Chemical Inc., Chicago, Ill.), the TRITON® series (Union Carbide Corp., Danbury, Conn.), the SURFONIC® series (Texaco Chemical Company, Houston, Tex.), the ETHOQUAD® series (Akso Chemical Inc., Chicago, Ill.), the ARMEEN® series (Akzo Chemical Inc., Chicago, Ill.), the ICONOL® series (BASF Corporation, Parsippany, N.J.), the SURFYNOL® series (Air Products and Chemicals, Inc. Allentown, Pa.), and the ETHOMEEN® series (Akzo Chemical Inc., Chicago, Ill.), to name a few.

Other suitable surfactants for use in the present invention are disclosed in, for example, Kirk-Othmer, *Encyclopedia of Chemical Technology*, 3rd edition, Vol 22 pages 332–386 and available manufacturing literature, including for example McCutcheon's *Emulsifiers & Detergents, NorthAmerican and International Edition* (McCutcheon Division, The MC Publishing Co., 1991); Ash, *The Condensed Encyclopedia of Surfactants* (Chemical Publishing Co., Inc. 1989); and, Ash, *What Every Chemical Technologist Wants to Know About . . . Emulsifiers and Wetting Agents*, Volume I (Chemical Publishing Co., Inc. 1988), all of which are incorporated herein by reference.

For purposes of the invention, one or more surfactants, as described above, may be present. In addition, one or more surfactants can be combined with one or more polymeric groups as described above.

The level of treatment of the various groups attached on the pigment can be any amount and preferably is from about 0.10 to about 50 micromoles/m$^2$, and more preferably is from about 0.30 to about 10 micromoles/m$^2$.

The modified pigment particles can then be subsequently subjected to cleaning procedures (e.g., washing or precipitation) which will remove substantially any excess reactants and unattached dispersants. The remaining slurry containing the modified pigment products can then be added to either aqueous or non-aqueous media and preferably with little or mild agitation to form stable (electrostatic, steric, and/or electrosteric) dispersions for a variety of end uses as described above.

The pigment products may be purified by washing, such as by filtration, centrifugation, or a combination of the two methods, to remove unreacted raw materials, byproduct salts and other reaction impurities. The products may also be isolated, for example, by evaporation or it may be recovered by filtration and drying using known techniques to those skilled in the art. Dispersions of the pigments of the present invention may be further purified or classified to remove impurities and other undesirable free species which can co-exist in the dispersion as a result of the manufacturing process. In a preferred embodiment, the cationic pigment dispersions are subjected to a classification step, such as centrifugation, to substantially remove particles having a size above about 1.0 micron, preferably above about 0.5 micron. In addition, the dispersion is preferably purified to remove any undesired free species, such as unreacted treating agent. Known techniques of ultrafiltration/diafiltration using a membrane or ion exchange may be used to purify the dispersion and remove a substantial amount of free ionic and unwanted species. Also preferred is an optional exchange of counterions whereby the counterions that form a part of the surface-modified pigment are exchanged or substituted with alternative counterions utilizing known ion exchange techniques such as ultrafiltration, reverse osmosis, ion exchange columns and the like. Particular examples of counterions that can be exchanged include, but are not limited to, $Na^+$, $K^+$, $Li^+$, $NH_4^+$, $Ca^{2+}$, $Mg^{2+}$, $Cl^-$, $NO_3^-$, $NO_2^-$, acetate, carboxylate, and $Br^-$. Such additional classification and purification methods are more fully described in U.S. patent application Ser. No. 09/240,291, filed Jan. 29, 1999, the disclosure of which is fully incorporated herein by reference.

Uses of the Modified Pigment Products

The modified pigment products of this invention may be used in the same applications as conventional pigments, like carbon blacks. The groups attached to the pigment, however, can be used to modify and improve the properties of a given pigment for a particular use.

Modified pigment products according to the invention can be used in a number of end use applications. These uses include, for example, plastic compositions, aqueous and non-aqueous inks, aqueous and non-aqueous coatings, rubber compositions, toner compositions, paper products, and textile and fiber compositions. The following paragraphs describe these uses generally and examples of each are shown below.

The modified pigment products of this invention can be used as colorants in a phase material. The modified pigment products of the invention can also be used to impart conductivity to a plastic material. The modified pigment products of the invention may give an increased rate of dispersion or improved quality of dispersion over the corresponding untreated pigment. These improvements offer an economic advantage in plastic manufacture and in value of the finished product, respectively. Using the modified pigment products of the invention may improve impact strength of the plastic. Thus, the invention releases to an improved plastic composition comprising a plastic and the modified pigment product.

As with conventional pigments, the modified pigment products can be used with a variety of plastics, including but not limited to plastics made from thermoplastic resins, thermosetting resins, or engineered materials, for example, composites. Typical kinds of thermoplastic resins include: (1) acrylonitrile-butadiene-styrene (ABS) resins; (2) acetals; (3) acrylics; (4) cellulosics; (5) chlorinated polyethers; (6) fluorocarbons, such as polytetrafluoroethylene (TFE), polychlorotrifluoroethylene (CTFE), and fluorinated ethylene propylene (FEP); (7) nylons (polyamides); (8) polycarbonates; (9) polyethylenes (including copolymers); (10) polypropylenes (including copolymers); (11) polystyrenes; (12) vinyls (polyvinyl chloride); (13) thermoplastic polyesters, such as polyethylene terephthalate or polybutylene terephthalate; (14) polyphenylene ether alloys; and blends and alloys of the above with rubber modifiers. Typical thermosetting resins include: (1) alkyds; (2) allylics; (3) the aminos (melamine and urea); (4) epoxies; (5) phenolics; (6) polyesters; (7) silicones; and (8) urethanes.

Generally, the modified pigment product is added like any other pigment to the plastic used to form a plastic premix. This can be done, for example, in a dry mix or a melt stage. The modified pigment product may also be incorporated on or in a plastic by adding it to a solvent, where the plastic is soluble or partially-soluble, followed by removal of the solvent (e.g., by evaporation). The modified pigment products of the invention may be used in combination with other conventional additives in plastic compositions. According to the invention, the term plastic composition includes, but is not limited to, any plastic material, article, goods, surface, fabric, sheet, film, and the like. For example, plastic materials include automotive parts, siding for homes, liners for swimming pools, roofing materials, packaging materials, synthetic fibers, food, and storage containers, light absorbing applications (e.g., bar codes), and any variety of other household or industrial items.

The modified pigment products of this invention are also useful in aqueous and non-aqueous ink formulations. Thus, the invention provides an ink composition comprising an ink vehicle and a modified pigment product. Other known ink additives may be incorporated into the ink formulation. Typical inks include, but are not limited to: lithographic, letterpress, flexographic, gravure, screening, phase change ink jet inks, and ink jet applications.

In general, an ink consists of four basic components: (1) a colorant, (2) a vehicle or varnish which functions as a carrier during printing; (3) additives to improve printability, drying, and the like, and (4) solvents to adjust viscosity, drying and the compatibility of the other ink components. For a general discussion of the properties, preparation and uses of inks, see The Printing Manual, 5th Ed., Leach et al, Eds. (Chapman and Hall, 1993) incorporated herein by reference. Various ink compositions are also disclosed, for example, in U.S. Pat. Nos. 2,833,736; 3,607,813; 4,104,833; 4,770,706; and 5,026,755, incorporated in their entirety herein by reference.

The modified pigment products of the invention, either as predispersion or as a solid, can be incorporated into an ink formulation using standard techniques. Use of a water dispersible or solvent-dispersible modified pigment product of the invention can provide a significant advantage and cost savings by reducing or eliminating the milling steps generally used with other conventional pigments.

Flexographic inks represent a group of ink compositions. Flexographic inks generally include a colorant, a binder, and a solvent. The modified pigment products of the invention are useful as flexographic ink colorants.

The modified pigment products of the invention can be used in news inks. For example, a news ink composition may comprise an ink vehicle (e.g., water), the modified pigment products of the invention, a resin, and optional conventional additives such as antifoam additives or a surfactant.

The modified pigment products of the invention may also be used in phase change (hot melt) inks. Phase change inks generally include at lest one colorant and at least one phase change or wax carrier (e.g., a fatty amide-containing material like a mixture of a tetra amide compound and a mono-amide compound, or an alkanolamides and polyethylene glycol mixture). The phase change ink is in a solid phase at ambient temperature and in a liquid phase at an elevated operating temperature of the printer. When the ink is heated it melts to form a low viscosity fluid that can be ejected as droplets. Upon jetting, heated droplets impact on a substrate, and cool to ambient temperature forming films of uniform thickness. Subsequent impaction of the droplets on the substrate may also occur, depending upon the type of printer used. Use of a modified pigment product can provide a significant advantage in dispersion stability and carrier compatibility over conventional pigments and in light-fastness over dyes.

The modified pigments of the present invention can also be used in lithographic or flexographic printing. For example, the ink or fountain solution used in the printing process can contain the modified pigments of the present invention.

The modified pigments of the present invention can also be used in the manufacture of lithographic printing plates, such as infrared or near-infrared laser-imageable printing plates. Typically, imaging occurs when the plate is exposed to radiation having wavelengths of between 800 and 1100 nm. Generally, an infrared or near-infrared laser-imageable lithographic printing plate includes at least the following layers: a grained-metal or polyester plate or sheet-like substrate and a radiation-absorptive layer coated thereon. Protective layers for the substrate or the surface of the coated plate may also be used in the present invention. When coated onto the substrate, the protective layer can also serve as an adhesion-promoting primer. Other layers may be used, for example, to improve adhesion between layers and durability of the printing plate. The radiation-absorptive layer contains the modified pigment of the present invention along with other conventional ingredients, such as resins and binders. In the imagining process, a lithographic printing plate is selectively exposed to a laser output or other source capable of removing or chemically modifying the radiation-absorbent layer or layers adjacent thereto. The laser output will define a pattern on the printing plate and remove or modify only those portions of the radiation-absorptive layer which define the pattern. Afterwards, the printing plate can be further developed by subjecting it to a solvent capable of removing the imaged layer(s), if any remains, which defines the same pattern. The details of the various conventional components and techniques for such printing plates are described in U.S. Pat. No. 5,493,971; EP 0 803 771 A1; EP 0 770 494 A2; EP 0 770495 A1; as well as PCT Publication WO-98/31550 and the patents and publications referenced therein, all of which are incorporated in their entirety by reference herein.

The modified pigment products of the invention may also be used in coating compositions such as paints or finishes, or the like. Thus, an embodiment of the invention is a coating composition comprising an aqueous or non-aqueous vehicle, resin or binder, and a modified pigment product. Other known coating additives may be incorporated in the coating composition. See, for examples, McGraw-Hill Encyclopedia of Science & Technology, 5th Ed. (McGraw-Hill, 1982), incorporated herein by reference. See also U.S. Pat. Nos. 5,051,464; 5,319,044; 5,204,404; 5,051,464; 4,692,481; 5,356,973; 5,314,945; 5,266,406; and 5,266,361, incorporated in their entirety by reference herein.

The modified pigment products of the invention, either as a prediserison or as a solid, can be incorporated into a coating composition using standard techniques. Use of a water or solvent dispersible modified pigment product provides a significant advantage and cost savings by reducing or eliminating the milling steps generally used with other conventional pigments.

The modified pigment products of the invention may also be used in paper compositions. Accordingly, the invention relates to a paper product comprising paper pulp and at least one modified pigment product.

The modified pigment products of the invention, either as a solid or a predispersion, can be incorporated into paper pulp using standard papermaking techniques as with conventional pigments. Use of a water or solvent dispersible modified pigment product discussed above may provide a significant advantage and cost savings by reducing or eliminating the steps generally used to disperse other conventional pigments.

The paper products of the invention may incorporate other known paper additives such as sizing agents, retention aids, fixatives, fillers, defoamers, deflocculating agents, and the like. Advantageously, the water or solvent dispersible modified pigment products discussed above are retained more efficiently at low loading levels when compared to the untreated pigments when retention aids and acidic or alkaline sizing agents are used.

The modified pigment products of the invention may also be used, as with conventional pigments, as pigments, fillers, and reinforcing agents in the compounding and preparation of rubber compositions. Accordingly, the invention relates to a rubber or elastomeric composition containing at least one rubber or elastomer and at least one modified pigment.

Carbon blacks, for example, are useful in the preparation of rubber vulcanizates such as those in tires. In generally desirable in the production of tires to utilize carbon blacks which produce tires with satisfactory abrasion resistance and hysteresis performance. The treadwear properties of a tire are related to abrasion resistance. The greater the abrasion resistance, the greater the number of miles the tire will last without wearing out. The hysteresis of a rubber compound means the difference between the energy applied to deform a rubber compound, and the energy released as the rubber compound recovers to its initial undeformed states. Tires with lower hysteresis values reduce rolling resistance and therefore are able to reduce the fuel consumption of the vehicle utilizing the tire. Thus, it is particularly desirable to have carbon black products capable of imparting greater abrasion resistance and lower hysteresis in tires.

The modified pigment products, and preferably the modified carbon black products of this invention are useful in both natural and synthetic rubber compositions or mixtures of natural and synthetic rubbers. Carbon black products comprising an aromatic sulfides group are preferred for this use. The carbon black products of the invention can be used in rubber compositions which are sulfur-cured or peroxide-cured.

The modified pigment products may be mixed with natural or synthetic rubbers by normal means, for examples by milling. Generally, amounts of the modified pigment product ranging from about 10 to about250 parts by weight can be used for each 100 parts by weight of rubber in order to impart a significant degree of reinforcement. It is, however, preferred to use amounts varying from about 20 to about 100 parts by weight of carbon black per 100 parts by weight of rubber and especially preferred is the utilization of from about 40 to about 80 parts of carbon black per 100 parts of rubber.

Rubbers suitable for use with the present invention are natural rubber and its derivatives such as chlorinated rubber. The modified pigment products of the invention may also be used with synthetic rubbers such as: copolymers of from about 10 to about 70 percent by weight of styrene and from about 90 to about 30 percent by weight of butadiene such as copolymer of 19 parts styrene and 81 parts butadiene, a copolymer of 30 parts styrene and 70 parts butadiene, a copolymer of 43 parts styrene and 57 parts butadiene and a copolymer of 50 parts styrene and 50 parts butadiene; polymers and copolymers of conjugated dienes such as polybutadiene, polyisoprene, polychloroprene, and the like, and copolymers of such conjugated dienes with an ethylenic group-containing monomer copolymerizable therewith such as styrene, methyl styrene, chlorostyrene, acrylonitrile, 2-vinylpyridine, 5-methyl 2-vinylpyridine, 5-ethyl-2-vinylpyridine, 2-methyl-5-vinylpyridine, alkyl-substituted acrylates, vinyl ketone, methyl isopropenyl ketone, methyl vinyl ether, alphamethylene carboxylic acids and the esters and amides thereof such as acrylic acid and dialkylacrylic acid amide; also suitable for use herein are copolymers of ethylene and other high alpha olefins such as propylene, butene-1 and pentene-1.

The rubber composition of the present invention can therefore contain at least one elastomer, curing agents, reinforcing filler, a coupling agent, and, optionally, various processing aids, oil extenders, and antidegradents. In addition to the examples mentioned above, the elastomer can be, but is not limited to, polymers (e.g., homopolymers, copolymers, and terpolymers) manufactured from 1,3 butadiene, styrene, isoprene, isobutylene, 2,3-dimethyl-1,3-butadiene, acrylonitrile, ethylene, propylene, and the like. It is preferred that these elastomers have a glass transition point (Tg), as measured by DSC, between $-120°$ C. and $0°$ C. Examples of such elastomers include poly(butadiene), poly(styrene-co-butadiene), and poly(isoprene).

Advantageously, the modified pigment products, and especially the modified carbon black products of the present invention can impart improved abrasion resistance and/or reduced hysteresis to rubber or elastomeric compositions containing them.

The modified pigment products of this invention may also be used to color fibers or textiles. Preferred modified pigment products for this use are the dispersible modified pigment products. Accordingly, the invention relates to fiber and textile compositions comprising a fiber or textile and a modified pigment product. Fibers suitable for use comprise natural and synthetic fibers such as cotton, wool, silk, linen, polyester and nylon. Textiles suitable for use comprise natural and synthetic fibers such as cotton, wool, silk, linen, polyester and nylon. Preferably natural fibers and textiles comprising cotton, wool, silk, and linen are used.

The modified pigment products of the present invention may be colored by means known in the art to color fibers and textiles with, for example, direct and acid dyes. Also, the modified pigments can be incorporated into fibers by spinning techniques, such as wet spinning, dry spinning, and melt spun techniques. For a general discussion of coloring with dyes, see Kirk-Othmer Encyclopedia of Chemical Technology, Vol 8 pp 280–350 "Dyes, Application and Evaluation" (John Wiles and Sons, 1979), incorporated herein by reference. Use of a water or solvent dispersible modified pigment product discussed above provides a method for coloring these materials with a lightfast colorant.

The present invention also relates to toner compositions comprising toner resin particles and the modified pigment particles of the present invention. Conventional additives as described in U.S. Pat. Nos. 5,278,018; 5,510,221; 5,275,900; 5,571,654; and 5,484,575; and EP O 270-066A1 can be used and these patents are incorporated herein by reference.

The present invention also relates to an inkjet ink composition comprising an aqueous or non-aqueous vehicle and a modified pigment product. In contrast to conventional pigments, the modified pigment products for use in the inkjet ink of the present invention are not difficult to disperse in an aqueous or non-aqueous vehicle. The modified pigment products do not necessarily require a conventional milling process, nor are additional dispersants necessarily needed to attain a usable ink. Preferably, the modified pigment products only require low shear stirring or mixing to readily disperse the pigment in water or other solvent.

Formation of an inkjet ink containing a vehicle and stably dispersed modified pigment product as pigment can be preformed with a minimum of components and processing steps when the above modified pigment products are utilized. Such an ink may be used in any inkjet printer known in the art. Preferably, in inkjet inks of the present invention, the modified pigment products are present in an amount of less than or equal to 20%–25% by weight of the inkjet ink. It is also within the bounds of the present invention to use an inkjet ink formulation containing a mixture of unmodified pigment with the modified pigment products of the present invention. Common additives such as those discussed below may be added to the dispersion to further improve the properties of the inkjet ink.

In particular, a humectant may be added to reduce the rate of evaporation of water in the ink to minimize clogging. If the ink begins to dry out, the humectant concentration increases and evaporation decreases further. Humectants may also affect other properties of the ink and prints made therefrom, such as viscosity, pH, surface tension, optical density, and print quality. Preferred humectants include ethylene glycol, propylene glycol, diethylene glycols, glycerine, dipropylene glycols, polyethylene glycols, polypropylene glycols, amides, ethers, carboxylic acids, esters, alcohols, organosulfides, organosulfoxides, sulfones, alcohol derivatives, carbitol, butyl carbitol, cellosolve ether derivatives, amino alcohols, and ketones.

Biocides such as benzoate or sorbate salts are important in preventing bacterial growth. Bacteria are often larger than ink nozzles and can cause clogging and other problems. Binders attach to the substrate to hold the colorant on the paper. Examples include polyester, polyester-malanine, styrene-acrylic acid copolymers, styrene-acrylic acid-alkyl acrylate copolymers, styrene-maleic acid copolymers, styrene-maleic acid-alkyl acrylate copolymers, styrene-methacrylic acid copolymers, styrene-methacrylic acid-alkyl acrylate copolymers, styrene-maleic half ester copolymers, vinyl naphthalene-acrylic acid copolymers, vinyl naphthalene-maleic acid copolymers, and salts thereof. Drying accelerating agents promote evaporation of the ink once the ink is placed in the paper. These include sodium lauryl sulfate, N,N-diethyl-m-toluamide, cyclohexylpyrrolidinone, and butyl carbitol. Penetrants such as alcohols, sodium lauryl sulfate, esters, and ketones allow the ink to penetrate the surface of the paper. Alcohols may also be used to increase the rate of drying of the liquid ink, and surfactants like detergents and soap reduce the surface tension to allow the ink to spread on the substrate.

Additionally, the modified pigment products-based inkjet inks may incorporate some dye to modify color balance and adjust optical density. Such dyes include food dyes, FD & C dyes, derivatives of phthalocyanine tetrasulfonic acids, including copper phthalocyanine derivatives, tetra sodium salts, tetra ammonium salts, tetra potassium salts, tetra lithium salts, and the like.

Polymers or oligomers may be added to inkjet inks based on the modified pigment products. The images created from such an ink may be water-insoluble upon polymerization or cross-linking of the added polymers or oligomers.

Additionally, in preparing inkjet inks utilizing the modified pigment products of the present invention, sequential filtration of the inks through filters of descending size or centrifugation or both may be used to obtain a more desirable final product. For instance, filtering first with a 3.0 micron filter and then filtering with a 1.0 micron filter, and so on, as desired. In addition, the size of the modified pigment products in the inkjet inks is preferably no larger than about 2 microns. More preferably, the size of the modified pigment product is one micron or less.

Advantageously, the inkjet inks of the invention have excellent stability over time and a wide range of temperatures, have desirable viscosities and surface tensions, and when printer, have good optical density, print clarity, rub resistance, and waterfasteness can be obtained when the inkjet ink contains certain stryenated acrylics that impart this property. For instance, one such stryenated acrylic has a molecular weight of about 4200, a polydispersibility of about 2, and acid number of about 215, a softening point of about 128° C., and a Tg of about 67° C. A commercially available example is JONCRYL 58 acrylic (JONCRYL is a registered trademark of Johnson Polymer, Racine Wis.), which is a solution of Joncryl 680.

The present invention will be further clarified by the following examples, which are intended to be purely exemplary of the present invention.

EXAMPLE 1

Preparation of Surfactant-Adsorbed Carbon Black Dispersions

Various amounts (Table 1) of carbon black, having a nitrogen surface area of 200 and a DBPA of 122 g/100 ml, a nonionic surfactant (IL-2798 from ICI Surfactants) described as an ester product of an amino benzoic acid and a polyethylene glycol methyl ether, MW of ~1,000 g/mole, and distilled water were mixed together and placed in stainless steel midget mills (2¹⁄₁₆" height by 2³⁄₃₂" internal diameter). Two hundred grams of ³⁄₁₆" stainless steel shot were added and the mill was capped and put in a Red Devil #30-5100 paint shaker. The samples were shaken for 1 h. before being removed and filtered through a paint filter to separate the slurries from the steel shot. An aliquot of the dispersions was analyzed for the amount of particles below 1 um, after the initial dispersion and 24 h. later, using a Zeiss light microscope containing a calibrated ocular lens. It was found that the amount of particles below 1 um was constant, regardless of the time period after dispersing. Results are set forth in Table 1.

TABLE 1

| Sample # | Carbon Black (g) | Surfactant (g) | Water (g) | Amount of Particles Below 1 um (%) |
|---|---|---|---|---|
| 1A | 6 | 0 | 34 | <5 |
| 1B | 2 | 4 | 34 | 80 |
| 1C | 4 | 8 | 28 | 90 |
| 1D | 6 | 12 | 22 | 90 |
| 1E | 8 | 16 | 16 | 98 |

This example shows that stable, conventional dispersions can be prepared with carbon black, surfactant, and water using mechanical energy, and that without a surfactant the carbon black does not disperse or form a stable dispersion.

EXAMPLE 2

Preparation of Chemically-Bonded Surfactants to Carbon Black and Resulting Dispersion Samples 1B–E were added to distilled water in a Pyrex beaker and heated to 70° C. Various amounts of sodium nitrite (Table 2) were added to the hot slurry with rapid mixing using a magnetic stir bar. Within one minute the slurries began to froth generating nitrogen gas. The reaction was allowed to proceed for 1 h. Table 2 lists the amounts of nitric acid and sodium nitrite used, as well as the resulting particle size. The amount of particles below one micron was constant after the initial reaction and 24 h. later. The original samples used 1B–1E are listed as 2B–E after the diazonium reaction occurred.

TABLE 2

| Sample # | Carbon Black (g) | Distilled Water (g) | Nitric Acid (g) | Sodium Nitrite (g) | Amount of Particles Below 1 um (%) |
|---|---|---|---|---|---|
| 2B | 2 | 38 | 0.140 | 0.153 | 80 |
| 2C | 4 | 36 | 0.280 | 0.307 | 85 |
| 2D | 6 | 34 | 0.420 | 0.450 | 85 |
| 2E | 8 | 32 | 0.560 | 0.613 | 90 |

EXAMPLE 3

Stability of Dispersions of Carbon Black with Chemically-Bonded and Absorbed Surfactants in Aqueous Salt Media Samples 1A–E and 2B–E were diluted, ~0.03% (w/w final dispersion in distilled water and added to aqueous sodium chloride solutions of various concentrations in test tubes, before being thoroughly shaken. The stability of the samples were determined by examining an aliquot of the dispersion using the microscope described in Example 1 after 24 h. of mixing, as well as visually observing the black dispersion in the test tube in the same time period. If more than 90% of the particles were above 1 um as determined using the light microscope, and the carbon black particles settled in the test tube, the sample was considered unstable. It was found that both phenomena occurred together. Stability of the samples are reported as a function of sodium chloride salt concentration in Table 3.

TABLE 3

| | Stability* as a function of Sodium Chloride Concentration (below) | | | | | |
|---|---|---|---|---|---|---|
| Sample # | 0 | 0.001M | 0.01M | 0.1M | 1M | 2M |
| 1A | Y | Y | Y | N | N | N |
| 1B | Y | Y | Y | N | N | N |
| 1C | Y | Y | Y | N | N | N |
| 1D | Y | Y | Y | N | N | N |
| 1E | Y | Y | Y | N | N | N |
| 2B | N | N | N | N | N | N |
| 2C | Y | Y | Y | Y | Y | Y |
| 2D | Y | Y | Y | Y | Y | Y |
| 2E | Y | Y | Y | Y | Y | Y |

*Stability is being reported as Y = Yes, stable or N = Not stable

This example shows that carbon black lacking surfactant and with absorbed surfactants are dependent on the media, and that above 0.01M concentration of sodium chloride, the dispersions become unstable. Last, the example demonstrates that when the surfactant is covalently attached (chemically bonded) to the surface of carbon black, the resulting dispersion is stable at all salt concentrations and that the surfactant is not in an equilibrium between the media and the carbon surface, as is the case with adsorbed surfactants. Also, a sufficient amount of surfactant, conditions to obtain samples 2C–2E, is needed to provide dispersion stability. The mechanism for stabilization with the nonionic surfactants, absorbed or bonded, is steric and not ionic.

EXAMPLE 4

Stability of Dispersions of Carbon Black with Chemically-Bonded and Adsorbed Surfactants in Non-Aqueous Media Samples 1A, 1E and 2E were dried and dispersed in different nonaqueous solvents to determine the effect of the surfactant on the resulting dispersion stabilities. The solids were added to the liquid media in a test tube stoppered and thoroughly shaken by hand. The concentrations and procedures were similar to those of Example 3. Results are reported in Table 4.

TABLE 4

| | Stability in Solvents | | | | | | |
|---|---|---|---|---|---|---|---|
| Sample | Ethanol | TPM[1] | IPA[2] | Toluene | Acetone | MEK[3] | MC[4] |
| 1A | N | N | N | N | N | N | N |
| 1E | N | N | N | N | Y | Y | Y |
| 2E | Y | Y | Y | Y | Y | Y | Y |

[1] = tripropylene glycol monomethyl ether
[2] = isopropyl alcohol
[3] = methylethylketone
[4] = methylene chloride This example shows that covalently attached or adsorbed surfactant black dispersion is stable in a wide variety of media, and is sterically-stabilized.

EXAMPLE 5

Inkjet Inks Containing Dispersions of Carbon Black with Chemically-Bonded and Adsorbed Surfactants This example demonstrates that an inkjet ink can be made with carbon black dispersions having adsorbed and bonded surfactants (Examples 1E and 2E). The carbon black samples, 1E and 2E were measured for particle size using a Leed's & Northrup (Honeywell) Microtrac UPA instrument and then added (final 5% (w/w ink) and mixed to an aqueous solution comprised of final 10% (w/w) 2-pyrrolidinone, final 10% (w/w/ ink) ethylene glycol, final 4% (w/w ink) isopropyl alcohol and distilled water. The inks were placed into an emptied and cleaned Canon BC-02 cartridges and printed using a Canon BubbleJet® 4200 inkjet printer on Xerox 4024 dual purpose paper and Plover Bond paper. The standard which lacked surfactant, sample 1A, would not print. The optical densities of the prints were determined with a MacBeth 915 optical densiometer. Dry time was found by pouring 0.5 ml of distilled water on a ¼ inch wide print, held at 45° angle and observing the time at which no black run off occurred. Results are shown in Table 5.

TABLE 5

| Sample | Mean Particle Size (um) | Largest Particle Size* (um) | Xerox Paper Dry Time O.D. | Xerox Paper Dry Time (H) | Plover Paper Dry Time O.D. | Plover Paper Dry Time (H) |
|---|---|---|---|---|---|---|
| 1E | 0.17 | 0.69 | 1.03 | 3 | 1.14 | 3 |
| 2E | 0.16 | 0.58 | 1.07 | 3 | 1.14 | 3 |

*largest particles as detected by Microtrac UPA instrument

This example shows that inkjet inks can be made with the dispersion of carbon black with adsorbed and bonded surfactants. The resulting print can achieve a good optical density and print waterfastness properties.

EXAMPLE 6

Inkjet Inks Containing Dispersions of Carbon Black with Chemically-Bonded and Adsorbed Surfactants Inkjet inks were made and tested in a similar manner as Example 5, except that 10% (final (w/w ink) diethylene glycol was used in place of 2-pyrolidone. Also, a highlighter (Avery HI-LITER®, series #24-0XX) was rubbed over the resulting print to determine highlighter smear. The highlighter was rubbed over the print two times and the amount of black runoff was noted. Dry time was determined as a function time. One ml of distilled water was applied to a ¼" line of print, and the time noted when no visible black runoff occurred. Results are reported in Table 6.

TABLE 6

| Sample | Xerox Paper | | Plover Paper | |
| --- | --- | --- | --- | --- |
| | O.D | Dry Time | O.D. | Dry Time |
| 1E | 1.08 | 24 h | 1.11 | 24 h |
| 2E | 0.97 | 5 min | 1.03 | 5 min |

This example shows that inkjet inks, besides those of Example 5, can be made with the dispersions of carbon black with adsorbed and bonded surfactants. The resulting print can achieve a fair optical density and print waterfastness, and excellent highlighter smear resistance. The dry time was significantly faster for the prints made with the dispersion of carbon black with the bonded surfactant compared to those for the equivalent having only the adsorbed surfactant.

EXAMPLE 7

Preparation of A Polymer

The purpose of this example is to describe the preparation of an polymer containing a primary amine that could be later chemically-bonded to pigments. A 250 mL three-neck round-bottom flask was equipped with a thermometer, a pressure-equalizing dropping funnel, a magnetic spin bar, and a refluxing condenser with a KOH drying tube. The flask was placed in an ice-bath on a magnetic stirrer. 4-Nitrobenzoyl chloride (9.3 g) and 50 mL of toluene were added to the flask first. Then the mixture of tripropylene glycol monomethyl ether (TPM, 10.31 g), triethyl amine in toluene (~100 mL), triethylamine in toluene (~100 mL) was added to the flask dropwise through the dropping funnel. After the addition, the ice-bath was removed and a heating mantel was put on and the reaction was refluxed at 90–100° C. for 4–5 hrs. After the reaction mixture was cooled down to room temperature, it was passed through a Buchner funnel (with qualitative filter paper, Whatman No. 10) and the filtrate was put into a separatory funnel. It was washed with 5% (w/w) potassium carbonate twice and 5% sodium chloride once and dried over sodium sulfate for 0.5 hr. The drying agent was filtered out by gravity filtration through a glass funnel with a piece of cotton. The filtrate was placed in a rotary evaporator to remove the toluene, leaving a solid (A 4-Nitrobenzoate tripropylene glycol monomethyl ether ester; NBT). Identification of the nitro ester was determined by NMR (using a Varian 400 MgHz, model 400VXR nmr instrument with a chloroform solvent).

NBT (17.8 g) was dissolved in methanol (100 ml) in the hydrogenation flask containing platinum oxide (0.1 g). The flask was put into a hydrogenation apparatus (Parr Corp.) and the sample was reduced (as evidenced by a color change—yellow to red to white-yellow) forming a 4-Aminobenzoate tripropylene glycol monomethyl ether ester (ABT). Identification of the amine ester was determined using the NMR procedure and conditions as previously described.

EXAMPLE 8

Preparation of A Chemically-Bonded Polymer to Carbon Black and Resulting Dispersions The purpose of this example was to prepare a carbon product having a chemically-bonded polymer. A carbon black (12.3 g), described in Example 1, was mixed into a hydrochloric acid (0.5 ml of 5 M concentration) and distilled water (61 g) solution. An ABT (2.0 g), described in Example 7, in acetone (44 g) solution as then mixed into the carbon black slurry. Next, a sodium nitrite (0.42 g) in distilled water (1.25 g) solution was added to the slurry and allowed to stir for two hours, with nitrogen gas evolution taking place. The slurry was then heated to 35–40° C. for three hours, before being cooled to room temperature and filtered using a Buchner funnel and filter paper described in Example 7. The slurry was washed with de-ionized water and dried, and Soxhlet extracted for ~16 h using methanol, and redried. The polymer-carbon black solids (6 g) were added to 34 g of TPM and dispersed using a Midget mill, the procedure was described in Example 1.

EXAMPLE 9

Preparation of Carbon Black Dispersions

The purpose of this example was to prepare dispersions of carbon black and of carbon black with non-chemically bonded ABT ester. Six grams of a carbon black described in Example 1 was added to TPM (34 g) and milled using a Midget mill, the procedure was described in Example 1. The product is designated Example 9A. In addition, the same carbon black (5.2 g) and ABT (0.8 g) and TPM (34 g) were also similarly milled. The product is designated Example 9B.

EXAMPLE 10

Properties of Inks Containing Chemically-Bonded Polymer to Carbon Black Pigments The purpose of this example was to contrast properties of inks containing different carbon black products. One ink contains a carbon product having a chemically-bonded polymer (Example 8), another has carbon black (Example 9A), and the last ink contains a carbon black and polymer mixture (Example 9B). The inks were made by mixing the solids (w/w) with TPM. A drop of the resulting inks were put between two glass slides and observed using a light microscope, with a calibrated ocular lens, at a magnification of 40× power. The ink with Example 8 was dispersed (Brownian movement with particles less than 1 um in diameter), while the other inks flocculated (the carbon blacks networked together to form a structure with a size above five um). Results are shown in Table 7.

TABLE 7

| | Observations | | |
| --- | --- | --- | --- |
| Sample No. | 8 | 9A | 9B |
| Observation | Dispersed | Flocculated and Settled | Flocculated |

After storing at 70° C. for a week, Example 8 was still well dispersed upon observation under the microscope while 9A and 9B settled.

The 7% products in TPM were drawn down on white paper (form 3NT-4 Ink Test Regular Bond paper) and brown paper (form 3NT-5 Ink Test Kraft paper), both from Leneta Co., using a 3 mil Bird applicator with a Byk-Gardner automatic draw down device. The resulting ink films were measured for optical density using the optical densiometer described in Example 5. The results are reported in Table 8.

TABLE 8

Optical Density of Ink Draw Downs for Example 10 Inks

| Paper | Optical Density for TPM Ink Containing Example 8 | Optical Density for TPM Ink Containing Example 9B |
|---|---|---|
| Regular Bond | 1.51 | 1.64 |
| Kraft | 1.53 | 1.73 |

This example shows that the nonaqueous dispersion with carbon black having chemically-bond polymer has a different dispersion profile and optical densities compared to that having the base black or that with the mixture of polymer with carbon black. The ink containing the modified carbon black from Example 8 was more penetrating into both papers, thus the lower optical density, compared to the other inks.

EXAMPLE 11

Preparation of A Polymer

The purpose of this example is to describe the preparation of a polymer containing a primary amine that could be later chemically-bonded to pigments. The procedures were similar to those used for Example 8, except that 17.5 g of poly(ethylene glycol) methyl ether (MW 350 g/mol) was used in place of the TPM, and 8.6 g of 4-nitrobenzoyl chloride was used instead of 9.3 g. Identification of the nitro- and amino-poly (ethylene glycol) esters were determined by NMR as also described in Example 8. The final product was aminophenyl poly(ethylene)glycol (APEG) molecule having a MW of 522 g/mole.

EXAMPLE 12

Preparation of A Chemically-Bonded Polymer to Carbon Black and Resulting Dispersions The purpose of this example was to prepare a carbon product having a chemically-bonded polymer in addition to chemically-bonded ionic groups. 4-Aminobenzoic acid (12.3 g) and APEG (14.1 g) were dissolved into distilled water (1500 g) before carbon black (150 g), described in Example 1, was stirred into the solution, Next, hydrochloric acid (5.2 ml of a 5 M solution) was added to the slurry, followed by sodium nitrate (8.28 g). The slurry was mixed at about 22° C. for 1 h followed by mixing at 40° C. for an additional hour. Nitrogen gas evolved after the sodium nitrite was added to the slurry. The sample was then dried for ~16 hours at 70° C.

EXAMPLE 13

Preparation of A Carbon Black Product and Resulting Dispersions

The purpose of this example was to prepare a carbon product having only chemically-bonded ionic groups. The sample was prepared as that of Example 12, except that no APEG was used.

EXAMPLE 14

Properties of Inks Containing Chemically-Bonded Polymer and Ionic Groups, and Chemically-Bonded Ionic Groups to Carbon Black Pigments The purpose of this example was to contrast properties of an ink with a carbon product having a chemically-bonded polymer and ionic groups against one with just ionic groups. Examples 12 and 13 were mixed into distilled water resulting in dispersion having 5% solids (w/w). The resulting inks were drawn down on Xerox 4024 paper and the dry time (waterfastness) and optical densities of the films were measured, all methods and instruments were previously described in Example 5. The results are shown in Table8.

| Ink with Example | Optical Density | Dry Time (min) |
|---|---|---|
| 12 | 1.65 | 5 |
| 13 | 1.54 | >5 |

The results show that the film formed from ink containing carbon black with chemically-bonded polymer and ionic groups dried faster, possibly due to its preparation into the paper compared to that formed from dispersions having just an ionic group. This example also shows that polymer and ionic groups can both be present on a pigment.

EXAMPLE 15

Infrared Absorptive Coating Composition

This example demonstrates that a modified carbon black prepared via the method of Example 2 can be used in the formulation of an infrared absorptive coating. The modified carbon black dispersion 2E should be dried prior to preparation of the coating. A useful infrared sensitive coating can be prepared by mixing together, with minor expenditure of energy, the ingredients shown below in parts by weight. Nitrocellulose E950 is available from Wolff Walsrode and Cymel 301 is available from Dyno Cyanamide.

| | |
|---|---|
| 2-butanone | 289.9 |
| Dry carbon black 2E | 5–10 |
| Nitrocellulose E950 | 3.68 |
| Cymel 301 | 0.69 |
| p-toluene sulfonic acid | 0.15 |

The coating composition can be applied to a substrate via a knife coater or wire wound rod to give a wet coating thickness of 20 microns. Examples of substrates that can be used are polyester or grained anodized aluminum.

To improve adhesion of the infrared adsorptive layer to the substrate, it may be advantageous to apply an additional layer to the substrate prior to applying the infrared adsorptive layer. This adhesion promoting layer can be based, for example, on polymeric materials containing hydroxyls or carboxyls, such as modified cellulosics and polyvinyl alcohols.

After drying to remove the volatile solvents and curing, the resulting composite can be imaged by selective ablation of the carbon black containing layer using infrared radiation (e.g., a diode laser emitting at 830 or 1064 nm).

Other embodiments of the present invention will be apparent to those skilled in the art from consideration of the specification and practice of the invention disclosed herein. It is intended that the specification and examples be considered as exemplary only, with a true scope and spirit of the present invention being indicated by the following claims.

What is claimed is:

1. A method to attach at least one group selected from an organic group or polymer group onto a pigment comprising reducing the average particle size of said pigment in a solvent and introducing a) at least one surfactant or polymer comprising at lest one said group and having at least one primary amine, b) a nitrite, and c) an acid in sufficient amounts together or in any combination to generate a diazonium salt comprising at least one said group, wherein at least a portion of said surfactant or polymer adsorbs onto at least a portion of the pigment.

2. The method of claim 1, wherein said surfactant or polymer further contains at least one non-ionic group.

3. The method of claim 1, wherein two or more different surfactants or polymers are introduced.

4. The method of claim 1, further comprising introducing a second diazonium salt comprising a second chemical group.

5. The method of claim 4, wherein the second chemical group comprises a carboxylic group, a sulfonate group, or salts thereof.

6. The method of claim 4, wherein the second chemical group is a carboxyphenyl group, a sulfophenyl group, or salts thereof.

7. The method of claim 1, wherein said surfactant or polymer comprises an aromatic group or an alkyl group.

8. The method of claim 1, wherein said acid is nitric acid or sulfuric acid.

* * * * *

UNITED STATES PATENT AND TRADEMARK OFFICE
CERTIFICATE OF CORRECTION

PATENT NO. : 6,432,194 B2
APPLICATION NO. : 09/752230
DATED : August 13, 2002
INVENTOR(S) : Johnson et al.

It is certified that error appears in the above-identified patent and that said Letters Patent is hereby corrected as shown below:

At column 3, line 36, the formula "-X[NIon]$_p$N" should be replaced with
-- -X-[NIon]$_p$R --.

Signed and Sealed this

Fifteenth Day of September, 2009

David J. Kappos
*Director of the United States Patent and Trademark Office*